United States Patent
Berkhout

(10) Patent No.: US 6,577,186 B2
(45) Date of Patent: Jun. 10, 2003

(54) PWM LIMITER

(75) Inventor: Marco Berkhout, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/864,140

(22) Filed: May 24, 2001

(65) Prior Publication Data
US 2002/0000877 A1 Jan. 3, 2002

(30) Foreign Application Priority Data
May 25, 2000 (EP) ............................................. 00201828

(51) Int. Cl.$^7$ ................................................ H03F 3/38
(52) U.S. Cl. ........................ 330/10; 330/207 A; 330/251
(58) Field of Search ................................ 330/10, 207 A, 330/251; 375/238; 332/109

(56) References Cited

U.S. PATENT DOCUMENTS

| 5,389,829 A | 2/1995 | Milazzo ...................... 327/172 |
| 5,777,512 A | * 7/1998 | Tripathi et al. ......... 330/207 A |
| 5,974,089 A | * 10/1999 | Tripathi et al. ............... 330/10 |
| 6,300,825 B1 | * 10/2001 | Dijkmans et al. ............. 330/10 |

FOREIGN PATENT DOCUMENTS

WO          9938255 A2      7/1999

* cited by examiner

Primary Examiner—Robert Pascal
Assistant Examiner—Khanh Van Nguyen
(74) Attorney, Agent, or Firm—Steven R. Biren

(57) ABSTRACT

A push-pull amplifier comprises a pulse width modulator with a limiter for limiting the modulation depth, whereby the problem that the output is switched to either highside or lowside is prevented, and thus the carrier frequency is always present in the output spectrum and the bootstrap capacitor is recharged each clock-cycle.

8 Claims, 5 Drawing Sheets

PWM LIMITER

TECHNICAL FIELD

Figure 1:
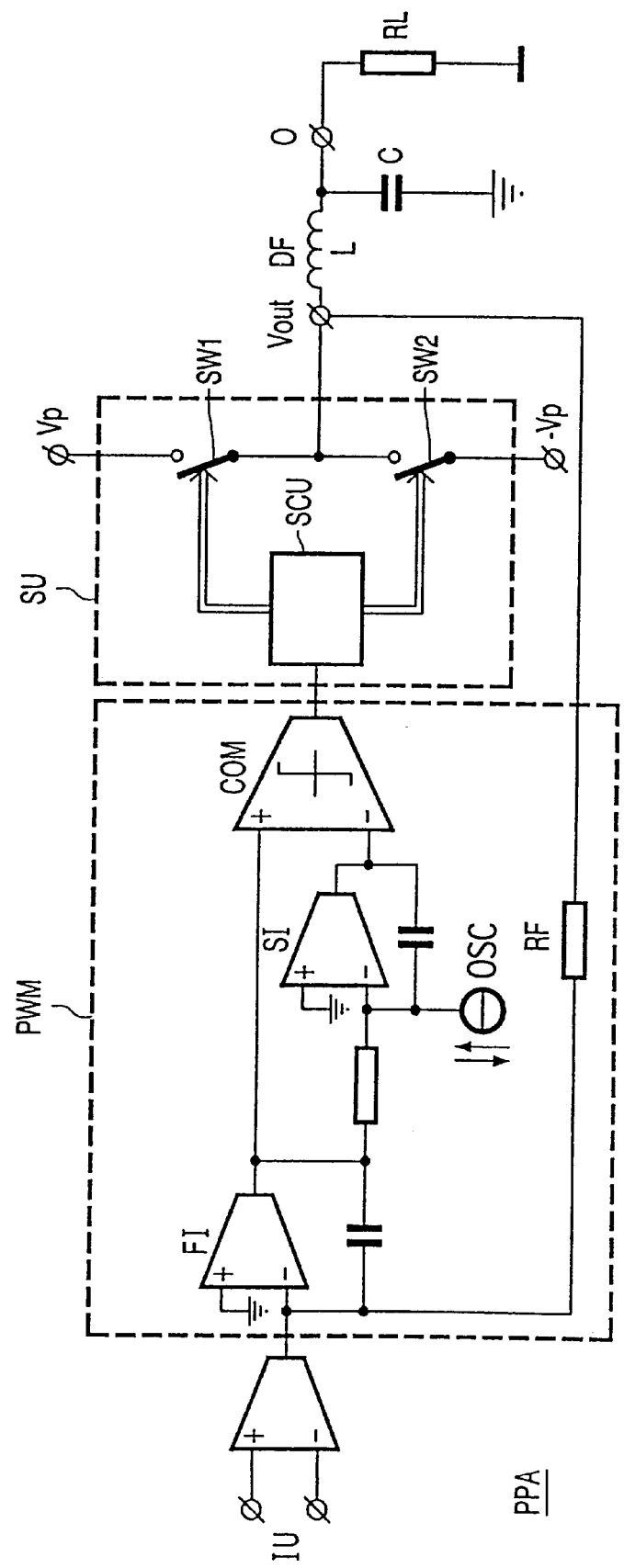

The invention relates to a push-pull amplifier as described in the preamble of claim 1.
The invention further relates to a pulse width modulator for use in such a push-pull amplifier.

BACKGROUND AND SUMMARY OF THE INVENTION

From an application note of National Semiconductor Corporation DS 101277 such a Class D amplifier is known. Herein a limiter is described to prevent one of the switches to remain active over an extended period of time.

A disadvantage of such a push-pull amplifier and of such a pulse width modulator is that the clip behaviour of this known push-pull amplifier is that the spectrum of the output signal is not predictable.

It is an object of the invention to provide a push-pull amplifier not having the disadvantage of the prior art. It is a further object of the invention to improve the push-pull amplifier further. To this end a push-pull amplifier according to the invention comprises the features of claim 1.

Herewith a cross-reference is made to the following co-pending applications of the same applicant and of the same date:

"Carrousel handshake" applicant's ref. Nr. ID603908, Application No. 0 201 818.2

"Level shifter" applicant's ref. Nr. ID60468, Application No. 0 201 826.5

"Silent start" applicant's ref. Nr. ID604681, Application No. 0 201 827.3

"Demodulation filter" applicant's ref. Nr. ID604683, Application No. 0 201 829.9.

Embodiments of the invention are described in the dependent claims.

BRIEF DESCRIPTION OF THE DRAWING FIGURES

Figure 2:
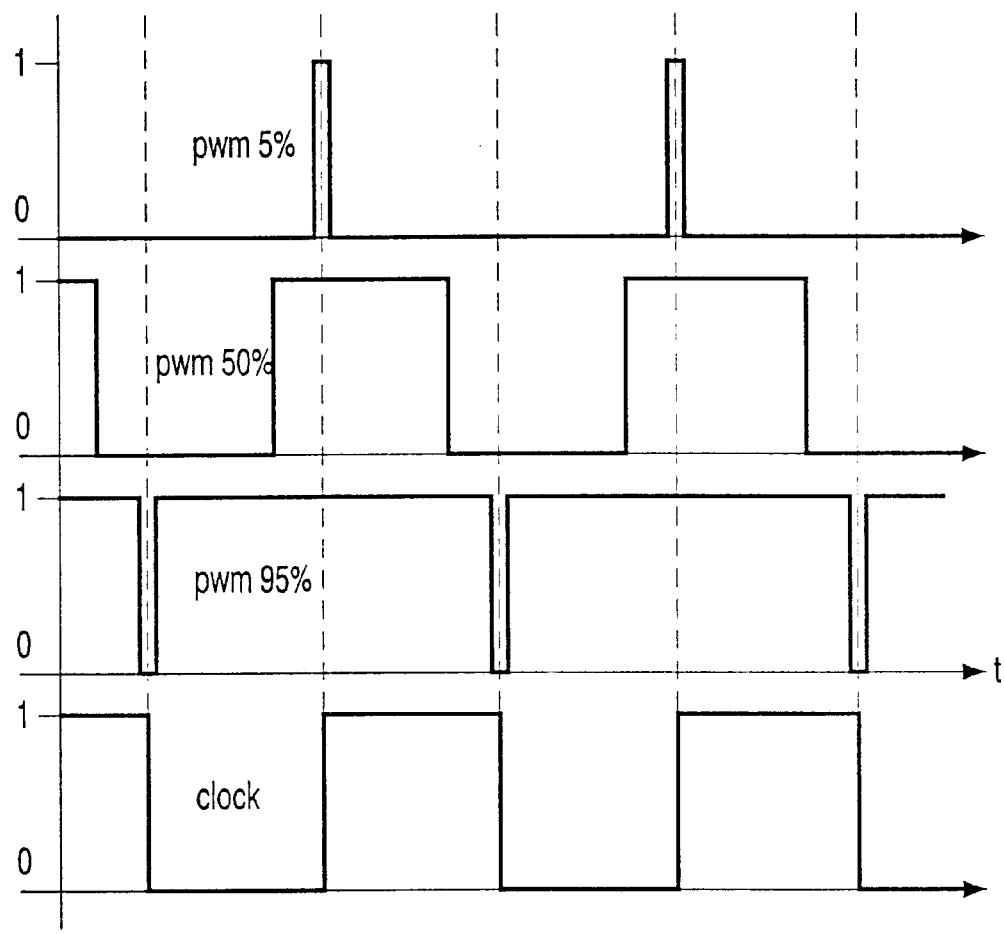
Figure 3:
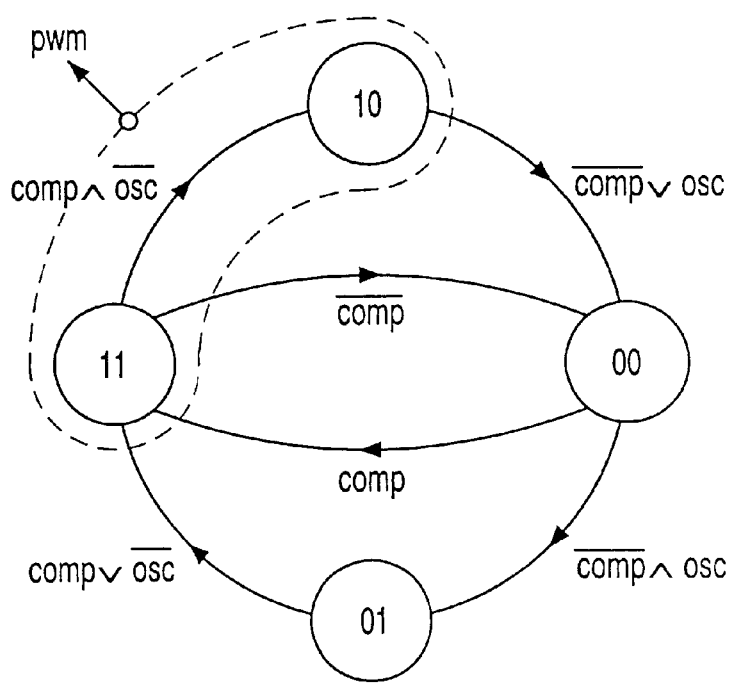
Figure 4:
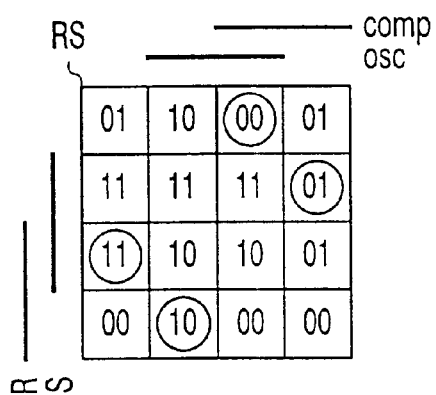
Figure 5:
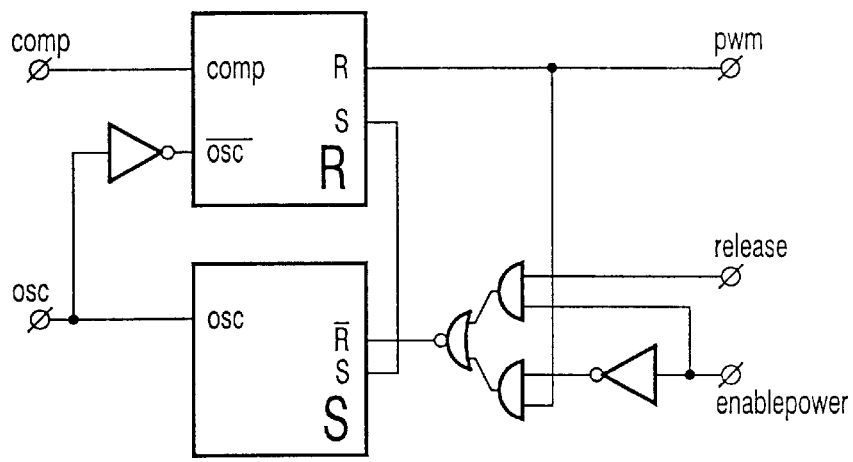
Figure 6:
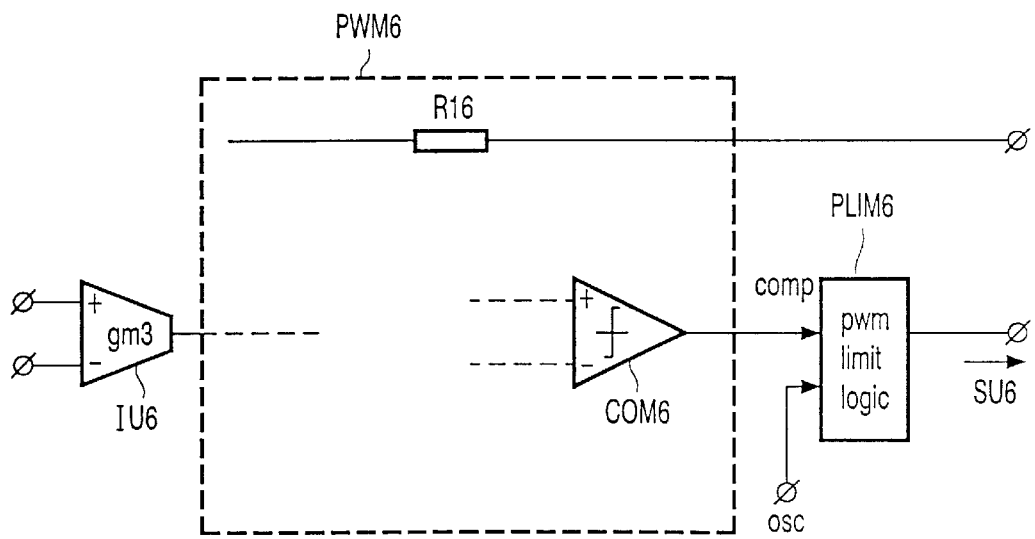
Figure 7:
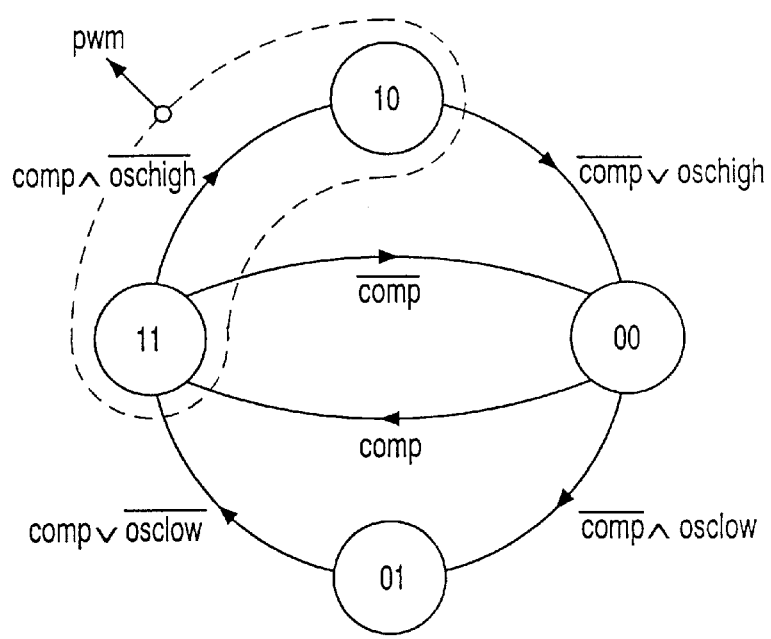

These and other aspects of the invention will be apparent from and elucidated with reference to the examples described hereinafter. Herein shows:

FIG. 1 block-schematically an example of a push-pull amplifier,

FIG. 2 timing of a pulse width modulator and oscillators signals,

FIG. 3 a state diagram of pulse width modulator limiting logic,

FIG. 4 a karnaugh map of pulse width modulator limiter logic,

FIG. 5 a pulse width modulator limiter logic implementation,

FIG. 6 an example of a pulse width modulator with a limiter,

FIG. 7 shows a state diagram of a further embodiment, and

Figure 8:
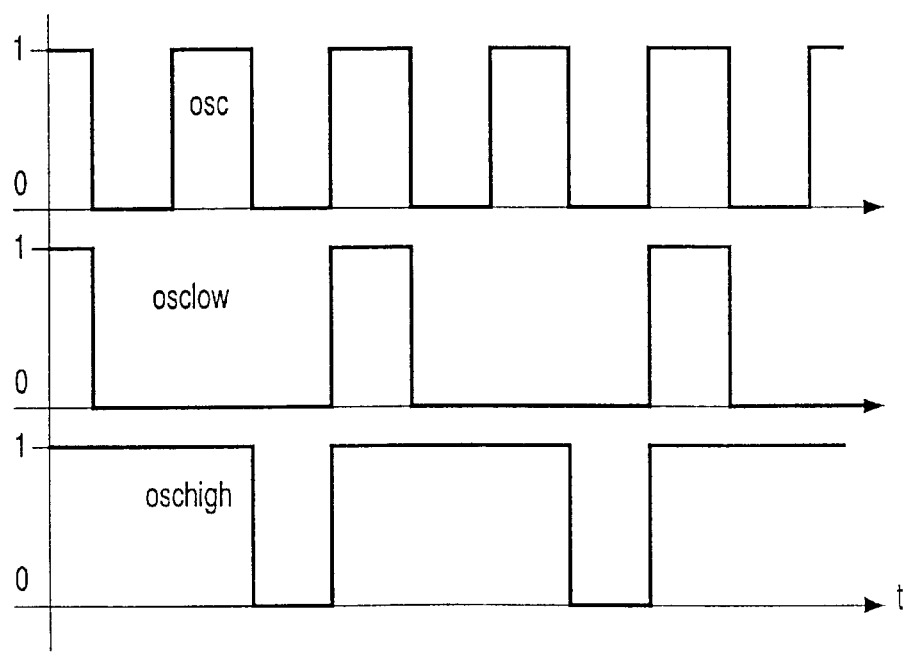

FIG. 8 the timing signals of the embodiment of FIG. 7.

DETAILED DESCRIPTION

FIG. 1 shows block-schematic an example of a push-pull amplifier PPA according to the invention. Via an input unit IU the amplifier receives the input signal. The input unit is coupled to a pulse-width modulator PWM, which is coupled with an output to a switching unit SU. The switching unit supplies an output signal via a demodulation filter DF to the output O of the amplifier.

The pulse-width modulator is coupled in a feedback loop with a feedback element RF which is coupled with one side to the output of the switching unit SU and with the other side to the input of the pulse-width modulator.

The pulse-width modulator further comprises a first integrator FI and a second integrator SI and a comparator COM, the input of the first integrator is coupled to the output of the input unit IU and the input of the second integrator is coupled to an output of the first integrator FI and also coupled to an oscillator OSC.

The switching unit SU comprises a switch control unit SCU and a first and second switch SW1, SW2, respectively. The demodulation filter is in this example shown as an inductance L and a capacitance C can be a second order low-pass demodulation filter or higher order demodulation filter.

Stability of the control loop with the pulse width modulator PWM can be guaranteed as long as the signal current $I_{sig}$ fed into the loop does not exceed the feedback current $I_{fb}$. If the signal current becomes too large the internal triangular signal diverge and the output is switched to either highside or lowside permanently until the input signal decreases again and the loop resumes control. After the demodulation filter this appears as clipping of the output signal. The clipping actually occurs in the pulse width modulation domain since the modulation depth is limited between 0–100%.

There are two reasons why it is undesirable that the output is switched permanently to one side.

First, of all the spectrum of the output signal becomes unpredictable. In the analysis of PWM signals and spectra it is assumed that the modulation is limited between 0–100%. As a result the high frequency spectrum concentrates around multiples of the carrier frequency. This effect can be exploited to choose the carrier frequency in such a way that the PWM signal does not interfere with other band limited high frequency signals. However, as soon as the PWM signal is clipping the carrier is not present anymore and the spectral components can appear at any frequency and disturb other signals.

Second, the switching unit in a push-pull amplifier can use a so-called bootstrap capacitor to supply the highside driver. As soon as the output is switched to the highside, the bootstrap capacitor is discharged by the highside driver. When the bootstrap voltage drops below a certain value the highside switch is switched off and the output of the switching unit becomes high ohmic. This can cause strange audible effects in the load (the loudspeaker for example).

Both effects described above can be avoided it the modulation depth is limited to, say 5–95%. In this way the carrier frequency is always present in the output spectrum and the bootstrap capacitor is recharged each clock-cycle. The modulation depth can be limited automatically by combining the output signal of the comparator COM with the clock signal.

Instead of the two integrators it is also possible to use only one integrator and supply at the inverting input of the comparator for example a sawtooth signal.

In FIG. 2 the timing of the pwm signal comparated to the oscillator are shown for modulation depths 5%, 50% and 95%.

As can be seen in FIG. 2 the rising edge of the pwm signal always precedes the rising edge of the oscillator signal and the same holds for the falling edges. Consequently, if the pwm signal is low during the rising edge of the oscillator the loop must be outside the control range. Now a very short pulse can be generated by the rising edge of the clock to switch the switching unit resulting in a pulse of minimal width at the output. The opposite holds for the falling edge. In this way the modulation depth is limited automatically. The length of the minimal output pulse is determined by the speed of the so-called handshake system, which can be used in the power path. In this form limiting of the modulation depth can be implemented as a logic function.

A state transition diagram of this logic function is shown in FIG. 3. From the state transition diagram a karnaugh map is derived which is shown in FIG. 4. The karnaughmap is translated directly in compound logic circuit implementations for bits R and S. consider the following situation. Suppose the control loop is out of the regulating range and the output of the comparator comp is constantly high. When the osc signal is also high the PWM limiter logic jumps to state 11 and the output pwm is high. Now when osc goes low the logic jumps to state 10 and pwm remains high. Then when osc goes high again the logic jumps to state 00 causing pwm to go low but then immediately jumps to state 11 causing pwm to go high again. Consequently the pwm signal shows a very short pulse which should cause the output of the switching unit to also show a (minimal) length pulse. The purpose of the PWM limiter is lost if the pwm pulse is not detected by the switching unit. To guarantee detection of the pwm signal a handshake can be used. The handshake is organized in such a way that in the previous example the PWM limiter logic remains instate 00 until the transition of the pwm signal has been confirmed from the switching unit. This confirmation is obtained from the release signal.

The logic implementation of the PWM limiter is shown in FIG. 5. When enablepower is low the switching unit is inactive and release is constantly high in this case the pwm signal is fed back directly and no handshaking is done with the switching unit. When enablepower is high the switching unit is active. Now release is fed back instead of pwm. Under normal circumstances the release signal follows the pwm signal with a small delay. Consequently the timing of the PWM limiter logic is synchronized with the carrousel.

Note that the minimal length of a pulse at the output of the switching unit is controlled by the switching unit self. The PWM limiter limits the maximal length of an output pulse by comparing it to the period of the oscillator.

In FIG. 6 a part of an example of the push-pull amplifier (see also FIG. 1) is shown. The input unit IU6 receives the input signal. In the pulse width modulator PWM6 a pulse width modulated signal is obtained to overcome the problems of prior art push-pull amplifiers between the pulse width modulator PWM6 and the switching unit SU6 a pulse width modulator limiter PLIM6 is placed, whereby the logic operates as described above.

It is to be noticed here that it is also possible to create each two clock cycles a pulse at the output instead of each clock cycle. Herewith the modulation depth can be enhanced without the disadvantages of the prior art.

FIG. 7 shows an amended state diagram with two signals osclow and oschigh from the oscillator signal osc. FIG. 8 shows the corresponding timing signals. Herewith during clipping the number of switchings is divided by two so further improving the performance of the amplifier and reducing the EMC.

Reference is made again to the "caroussel Handshake" application of the same applicant wherein is described that the minimal length of the pulse at the output is determined in the caroussel.

What is claimed is:

1. A push-pull amplifier having an input for receiving an input signal and an output for supplying an output signal wherein the push-pull amplifier comprises a pulse width modulator comprising at least one integrator, a comparator and a feedback element, a switching unit coupled to an output of the pulse width modulator and a demodulator filter coupled to an output of the switching unit, characterized in that the pulse width modulator comprises a pulse width modulator limiter for limiting modulation depth.

2. A push-pull amplifier as claimed in claim 1 characterized in that the pulse width modulator limiter comprises a logic circuit with a first input and a second input for receiving at the first input a comparator output and at the second input an oscillator signal at an output coupled to the output of the push-pull amplifier.

3. A push-pull amplifier as claimed in claim 1 characterized in that the push-pull amplifier is a class D amplifier.

4. A pulse width modulator limiter for use in a push-pull amplifier as claimed in claim 1, comprising a logic circuit with a first input for receiving an output from a comparator of the push-pull amplifier and a second input for receiving a signal from an oscillator at an output coupled to the output of the push-pull amplifier.

5. A push-pull amplifier of claim 1 characterized in that the pulse width modulator comprises at least two integrators.

6. A push-pull amplifier of claim 1 characterized in that the switching unit comprises at least two switches.

7. A push-pull amplifier of claim 1 characterized in that the modulation depth is limited to above 0 but less than 100%.

8. A push-pull amplifier of claim 7 characterized in that the modulation depth is limited to between 5% and 95%.

* * * * *